United States Patent
Delacruz et al.

(10) Patent No.: US 12,113,054 B2
(45) Date of Patent: Oct. 8, 2024

(54) NON-VOLATILE DYNAMIC RANDOM ACCESS MEMORY

(71) Applicant: ADEIA SEMICONDUCTOR TECHNOLOGIES LLC, San Jose, CA (US)

(72) Inventors: Javier A. Delacruz, San Jose, CA (US); Pearl Po-Yee Cheng, Los Altos, CA (US); David Edward Fisch, Pleasanton, CA (US)

(73) Assignee: Adeia Semiconductor Technologies LLC, San Jose, CA (US)

(*) Notice: Subject to any disclaimer, the term of this patent is extended or adjusted under 35 U.S.C. 154(b) by 747 days.

(21) Appl. No.: 17/070,253

(22) Filed: Oct. 14, 2020

(65) Prior Publication Data

US 2021/0118864 A1   Apr. 22, 2021

Related U.S. Application Data

(60) Provisional application No. 62/923,839, filed on Oct. 21, 2019.

(51) Int. Cl.
*H01L 25/18* (2023.01)
*H01L 23/00* (2006.01)
*H01L 25/065* (2023.01)

(52) U.S. Cl.
CPC .............. *H01L 25/18* (2013.01); *H01L 24/08* (2013.01); *H01L 25/0657* (2013.01);
(Continued)

(58) Field of Classification Search
None
See application file for complete search history.

(56) References Cited

U.S. PATENT DOCUMENTS 5,753,536 A   5/1998   Sugiyama et al.
5,771,555 A   6/1998   Eda et al.
(Continued)

FOREIGN PATENT DOCUMENTS

| JP | 2013-033786 A | 2/2013 |
| JP | 2018-160519 | 10/2018 |
| WO | WO 2005/043584 A2 | 5/2005 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
(Continued)

*Primary Examiner* — Hung K Vu
(74) *Attorney, Agent, or Firm* — Knobbe, Martens, Olson & Bear, LLP

(57) ABSTRACT

The present disclosure provides for a stacked memory combining RAM and one or more layers of NVM, such as NAND. For example, a first layer of RAM, such as DRAM, is coupled to multiple consecutive layers of NAND using direct bonding interconnect (DBI®). Serialization and overhead that exists in periphery of the NVM may be stripped to manage the data stored therein. The resulting connections between the RAM and the NVM are high bandwidth, high pincount interconnects. Interconnects between each of the one or more layers of NVM are also very dense.

19 Claims, 8 Drawing Sheets

(52) U.S. Cl.
CPC .............. *H01L 2224/08145* (2013.01); *H01L 2924/1431* (2013.01); *H01L 2924/1436* (2013.01); *H01L 2924/14511* (2013.01)

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 6,952,368 B2 | 10/2005 | Miura et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,554,830 B2 | 6/2009 | Miura et al. | |
| 7,750,488 B2 | 7/2010 | Patti et al. | |
| 7,803,693 B2 | 9/2010 | Trezza | |
| 7,872,895 B2 | 1/2011 | Miura et al. | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,397,013 B1 | 3/2013 | Rosenband et al. | |
| 8,432,716 B2 | 4/2013 | Miura et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,611,123 B2 | 12/2013 | Koh | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,754,667 B2 | 9/2017 | Alsmeier | |
| 9,799,587 B2 | 10/2017 | Fujii et al. | |
| 9,852,988 B2 | 12/2017 | Enquist et al. | |
| 9,859,004 B1 | 1/2018 | Alsmeier | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,707,087 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,195,748 B2 | 12/2021 | Uzoh et al. | |
| 11,205,625 B2 | 12/2021 | DeLaCruz et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,296,053 B2 | 4/2022 | Uzoh et al. | |
| 11,329,034 B2 | 5/2022 | Tao et al. | |
| 11,348,898 B2 | 5/2022 | DeLaCruz et al. | |
| 11,355,404 B2 | 6/2022 | Gao et al. | |
| 11,355,443 B2 | 6/2022 | Huang et al. | |
| 11,367,652 B2 | 6/2022 | Uzoh et al. | |
| 11,373,963 B2 | 6/2022 | DeLaCruz et al. | |
| 11,380,597 B2 | 7/2022 | Katkar et al. | |
| 11,385,278 B2 | 7/2022 | DeLaCruz et al. | |
| 11,387,202 B2 | 7/2022 | Haba et al. | |
| 11,387,214 B2 | 7/2022 | Wang et al. | |
| 11,393,779 B2 | 7/2022 | Gao et al. | |
| 11,462,419 B2 | 10/2022 | Haba | |
| 11,476,213 B2 | 10/2022 | Haba et al. | |
| 11,515,291 B2 | 11/2022 | DeLaCruz et al. | |
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2014/0175655 A1 | 6/2014 | Chen et al. | |
| 2015/0064498 A1 | 3/2015 | Tong | |
| 2016/0343682 A1 | 11/2016 | Kawasaki | |
| 2017/0338214 A1* | 11/2017 | Uzoh | H01L 24/08 |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |

(56) References Cited

U.S. PATENT DOCUMENTS

| | | |
|---|---|---|
| 2019/0115277 A1 | 4/2019 | Yu et al. |
| 2019/0131277 A1 | 5/2019 | Yang et al. |
| 2019/0245543 A1* | 8/2019 | Lee .................. G11C 13/0007 |
| 2019/0333550 A1 | 10/2019 | Fisch |
| 2019/0385935 A1 | 12/2019 | Gao et al. |
| 2020/0013765 A1 | 1/2020 | Fountain, Jr. et al. |
| 2020/0035641 A1 | 1/2020 | Fountain, Jr. et al. |
| 2020/0294908 A1 | 9/2020 | Haba et al. |
| 2020/0328162 A1 | 10/2020 | Haba et al. |
| 2020/0395321 A1 | 12/2020 | Katkar et al. |
| 2021/0098412 A1 | 4/2021 | Haba et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |

OTHER PUBLICATIONS

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023). 1 page.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.", 3 pages.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.", 1 page.

* cited by examiner

NON-VOLATILE DYNAMIC RANDOM ACCESS MEMORY

CROSS-REFERENCE TO RELATED APPLICATIONS

The present application claims the benefit of the filing date of U.S. Provisional Patent Application No. 62/923,839 filed Oct. 21, 2019, the disclosure of which is hereby incorporated herein by reference.

BACKGROUND

Various types of existing memory each have significant limitations. For example, Dynamic Random Access Memory (DRAM) is fast, but low density and volatile. NAND is dense and inexpensive, but slow. Magnetic RAM (MRAM) is neither dense nor fast, and is also relatively expensive.

While some solutions have sought to combine NAND and DRAM, they are combined at the package level. For example, while some packages have been created that include both a NAND and a DRAM, each of the NAND and DRAM has separate interfaces with input and output. Accordingly, such solutions retain the inefficiencies of the individual memories.

DETAILED DESCRIPTION

Overview

Figure 1:
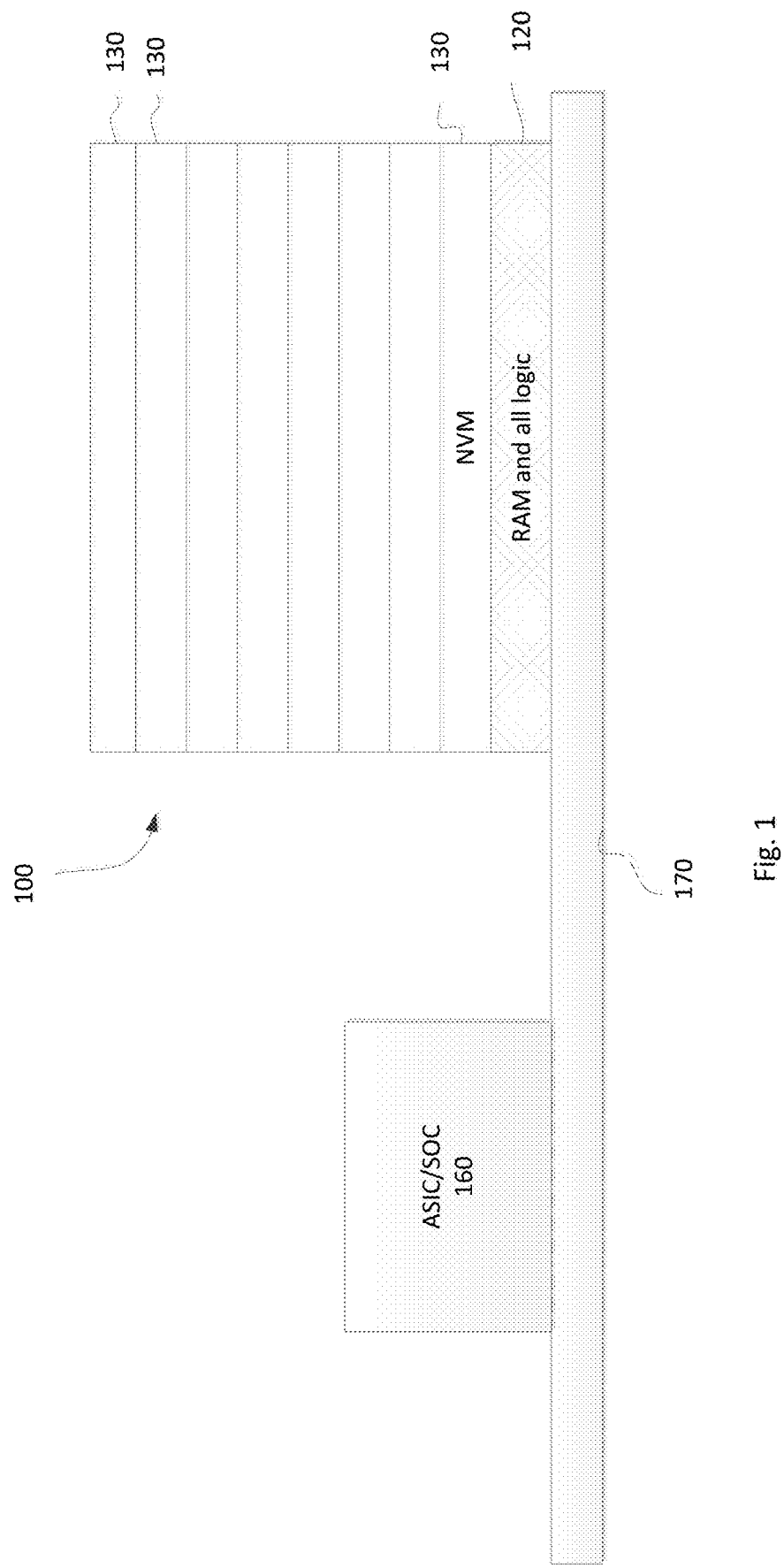
FIG. 1 is a side view of an example stacked memory combining RAM and one or more layers of non-volatile memory (NVM) according to aspects of the disclosure.

The present disclosure provides for a stacked memory combining RAM and one or more layers of NVM, such as NAND. For example, a first layer of RAM, such as DRAM, is coupled to multiple consecutive layers of NAND using direct bonding interconnect (DBI®). Serialization and overhead that exists in periphery of the NVM may be stripped to manage the data stored therein. The resulting connections between the RAM and the NVM are high bandwidth, high pincount interconnects. Interconnects between each layer of NVM are also very dense.

According to some examples, the RAM may store logic for the NVM. In other examples, a separate layer of logic for the NVM may be coupled in the stack between the RAM and the NVM. While including the NVM logic in the DRAM layer may provide for a smaller stack size as compared to including the logic in a separate layer, having a separate non-volatile logic layer frees up more of the RAM for memory.

The RAM may include an interface for receiving data for storage and outputting data from storage. The logic may determine which data is stored in NVM and which data is buffered for RAM storage. According to some examples, data to be stored in the memory stack may be tagged to indicate whether it is for short term storage in the RAM or long term storage in the NVM layers. Just as one example, machine learning may be used to detect whether the data received at an input to the DRAM is intended for short term or long term storage.

DRAM arrays can serve as registers and temporarily hold data loaded from a flash NVM plane and in turn supply this data to the outside world. Multiple registers operating together can allow for proportionally faster uninterrupted I/O speeds. For example, if four registers are used, each associated with a different flash memory array (plane), if the array page load speed is 25 us, a clock speed of 12 ns could be supported. 8 planes could support a read clock speed of 6 ns.

The RAM may also be used in write operations and can accept external data while other RAM arrays are supplying data to the NVM for programming. For example, while the NVM layers are writing data to storage, the RAM layer may continue to receive additional data as input without waiting for the NVM write to complete. Because programming operations are typically longer than page load operations (eg. ~300 us/page programming vs. 25 us/page for reads), data can be fully loaded into the RAM arrays before programming operations are complete.

The combined NVM and RAM stack described here may be useful for a variety of different applications, including, for example, machine learning applications. For example, machine learning applications may require weight memory, such as information that has been learned that is needed to perform computation. The weight memory can be a large amount of memory, wherein moving that weight memory burns a large amount of power. However, moving the data over the highly parallel path between the NVM in the stack and the RAM may be done over a short electrical distance, and therefore not burn as much power. Because in a machine learning application it is known ahead of time when the weight memory will be used, the weight memory can be queued and loaded into RAM for faster access. For example, if it is known that the weight memory is used sequentially to multiply accumulate (MAC) operations with activations, access to the weight memory can be queued for faster operation. Moreover, the NVM can automatically write as the RAM is exchanging information with a controller, such as an application specific integrated circuit (ASIC) or system on chip (SoC). At the same time, the NVM can also start reading the next operation.

A process for making the combined NVM and RAM stack may start with a larger layer of NVM. Multiple additional layers of NVM may be bonded thereto, for example, using DBI®. The RAM layer may then be bonded to a bottommost layer of the NVM. The result resembles a single die that can be stacked on another die, mounted on an interposer, or packaged independently.

Example Structures

FIG. 1 illustrates a first example of the stacked memory combining RAM and one or more layers of NVM. In particular, stack 100 and controller 160 are positioned on and interconnected by a circuit board or package 170. The controller 160 may be any of variety of types of controllers. For example, the controller may be a system on chip (SoC), application specific integrated circuit (ASIC), or the like. The stack 100 includes a RAM layer 120 at a base of the stack, and a plurality of layers of non-volatile memory (NVM) 130 stacked above the RAM layer 120.

The NVM layers 130 may include any of a variety of types of nonvolatile memory, such as NAND flash memory, NOR flash memory, EPROM, EEPROM, magnetoresitive RAM (MRAM), phase change RAM, etc. Each layer of NVM may be bonded together using, for example, low temperature bonding techniques such as DBI®. Each layer of NVM may be, for example, approximately 50 μm thick or less. While several layers of NVM 130 are shown, it should be understood that any number of NVM layers 130 may be included in the stack. A total thickness of the NVM layers 130 may be, for example, 450 μm or less.

The RAM layer 120 may be dynamic RAM (DRAM), static RAM (SRAM), Synchronous Dynamic RAM (SDRAM), Single Data Rate Synchronous Dynamic RAM (SDR SDRAM), Double Data Rate Synchronous Dynamic RAM (DDR SDRAM, DDR2, DDR3, DDR4), Graphics Double Data Rate Synchronous Dynamic RAM (GDDR SDRAM, GDDR2, GDDR3, GDDR4, GDDR5), NRAM, RRAM, or any of a variety of other types of memory. The RAM layer 120 includes an external interface for communication with the controller 160, the external interface further providing for communication between the NVM layers 130 and the controller 160.

The RAM layer 120 is also interconnected to a bottom layer of NVM in the stack 100. For example, the RAM layer 120 may be bonded using various bonding techniques, including using direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety).

According to the example of FIG. 1, logic for the RAM and the NVM layers 130 may all be stored in the RAM layer 120. Integration of the NVM logic into the RAM layer 120 may provide for a smaller physical size of the stack.

Figure 2:
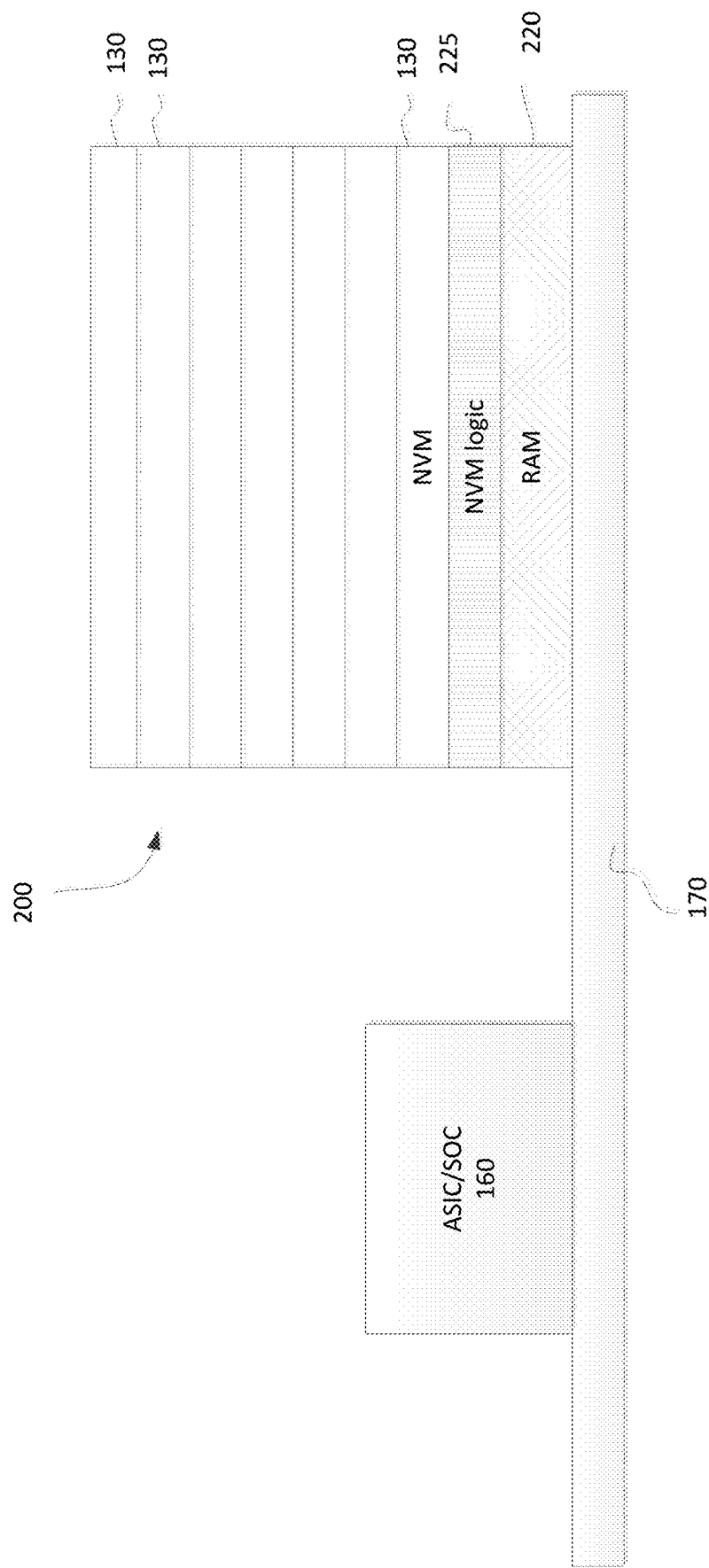
FIG. 2 is a side view of another example stacked memory combining RAM and one or more layers of NVM according to aspects of the disclosure.

In another embodiment, shown in FIG. 2, logic for the NVM layers 120 may be stored in a separate NVM logic layer 225. In this example, RAM layer 220 may include more memory space as compared to the example of FIG. 1. Additionally, NVM logic layer 225 may be removed and replaced with another NVM logic layer if needed. For example, if additional NVM layers are added, or if updated logic is available, the logic layer 225 may be exchanged for an updated logic layer.

In either embodiment of FIG. 1 or FIG. 2, as the RAM layer 120, 220 receives data for storage, the logic may be used to determine how the data is stored. As one example, the data may be tagged, wherein the tags provide an indication of whether the data should be stored in short term memory or long term memory. For example, the tag may be one or more bits. If the bit is set to 1, for example, the data may be stored in RAM, whereas if the bit is set to 0, the data may be stored in NVM. Data tagging can also have a different bit pattern which will provide the necessary identification to determine the storage location of the data. Just as one example, the tags may identify a type of data, such as whether the data is a lookup table, weight memory, intermediate data, etc. As the data is received, the logic may determine, based on the tag, whether to buffer the data in RAM layer 120 for short term use, or to move the data up the stack to the NVM layers 130 for long term use.

According to one example, if a time to complete a read load, such as moving data from flash cells to a register, is 25 us, and a clock speed is 24 ns, moving 2112 bytes, 2 bytes at a time, will require 1056 clock cycles. 1056 cycles*24 ns/cycle=25.344 us. With this example scenario, if a first register has been filled with data, and has been sending the data out through the I/O's 2 bytes at a time, it will have completed that operation in 25.344 us. While this operation has been in progress, a $2^{nd}$ register could be loaded from a new NAND flash page and could be ready to start providing its data to other devices outside the stack. The process may continue with the first register getting filled by the flash array while the $2^{nd}$ register is providing data to other devices outside the stack. This allows a continuous read of data from flash memory. If the array is slower and needs more time to load a page from the flash array to its register, then a slower clock speed would be necessary to avoid dead cycles if ping ponging between two registers.

According to some examples, a capacitive layer may also be included in the combined memory stack. For example, a wafer layer may be configured to hold a charge. Just as one example, the wafer layer may include a layer of silicon with collimated pores that is covered with dielectric. The capacitive layer may be at a top of the NVM stack, furthest from system-level connections, stacked between the RAM layer and the NVM layers, or in any other layer. In the event of a power outage, the capacitive layer may provide enough power to finish writing anything remaining in the RAM layer to the NVM layers.

Figure 3:
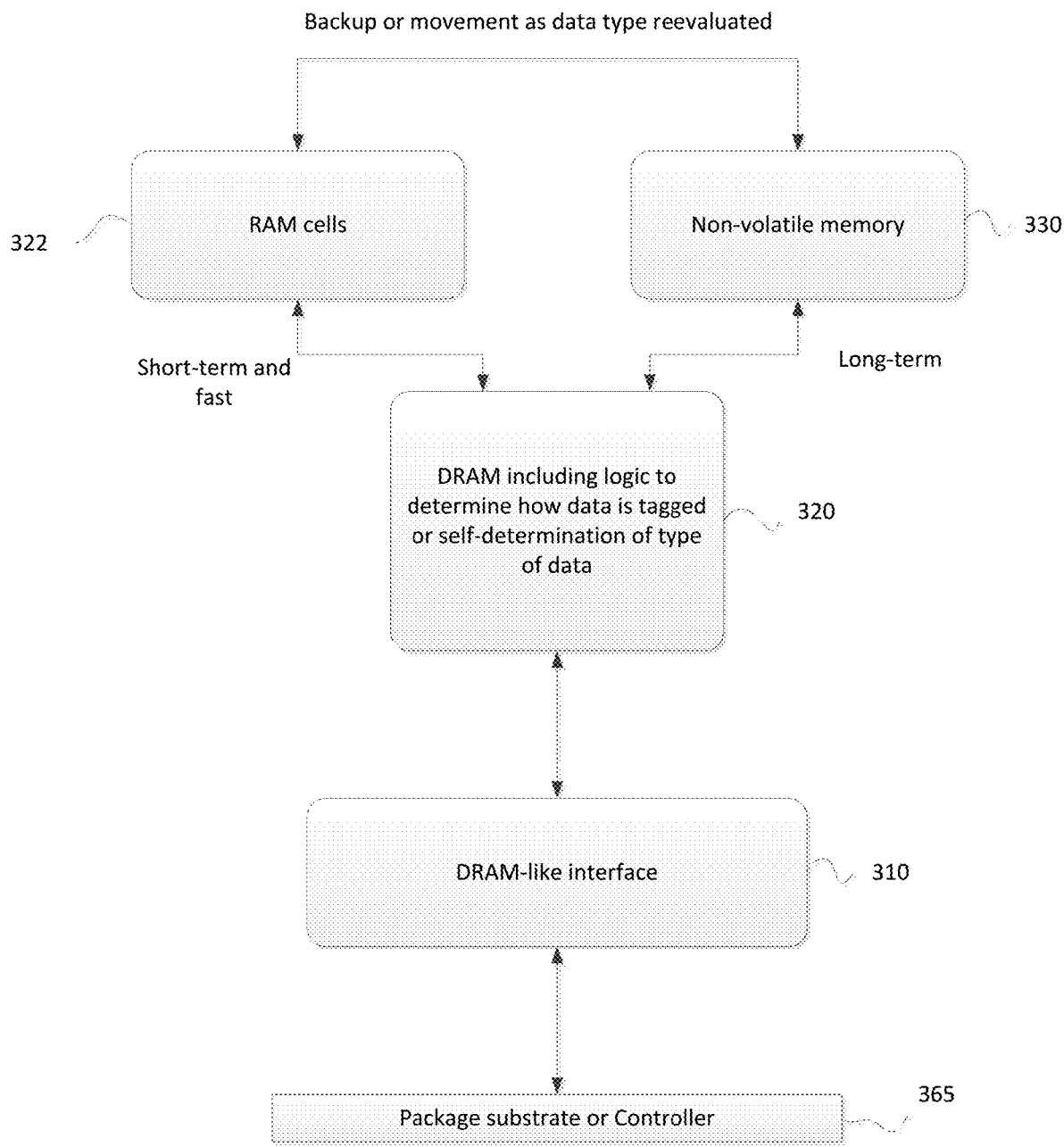
FIG. 3 is a relational diagram of components of the stacked memory according to aspects of the disclosure.

FIG. 3 illustrates an example of data flow for data that is received by the stack for storage, or data being accessed by an external device. DRAM-like interface 310 communicates with external devices, such as package substrate or controller 365. The DRAM-like interface 310 may include, for example, bumps, pads, pillars, DBI, or any other type of interconnect. DRAM-like interface 310 may receive data to be stored in memory, and the DRAM uses logic 320 to determine where the data should be stored. For example, the logic may look at tags on the data to determine whether the data is better suited for long term storage or short term storage. The tags may be assigned by a processor, such as ASIC/SoC 160 of FIG. 2.

In some examples, the logic for determining where the data should be stored may include a machine learning algorithm. For example, data usage may be evaluated. What is learned from the evaluations may be used to better classify data that is received, wherein the classifications determine where the data is stored.

Once it is determined whether the data should be stored in long term or short term storage, the data is moved to NVM 330 or to RAM cells 322, respectively. According to some aspects, the data stored in NVM 330 and/or Ram cells 322 may be reevaluated from time to time, and moved based on the reevaluation. For example, if a first set of data stored in NVM 330 is accessed more frequently than a second set of data stored in RAM 322, the first set of data may be moved to RAM 322 and/or the second set of data may be moved to NVM 330. As another example, if the RAM 322 is becoming full, some of the data stored therein may be moved to NVM 330.

Similar to the way in which the data is moved up from the external device through the layers of the memory stack to store the data, data may be accessed by communications through the DRAM-like interface 310. Further, data may be moved down the stack and transmitted out to external devices through the DRAM-like interface 310.

An I/O path between the RAM layer and the NVM layers may be relatively wide. For example, as described in further detail below in connection with FIGS. 4-6, a layer of NVM may include multiple planes, with each plane having multiple memory blocks and each memory block configured to store multiple pages of data. The RAM may be configured such that it can load an entire page simultaneously to the NVM. Speeds of write/read operations may be increased to increase the speed to the NVM. Such pipelining frees up RAM capacity for subsequent operations more quickly.

Figure 4A:
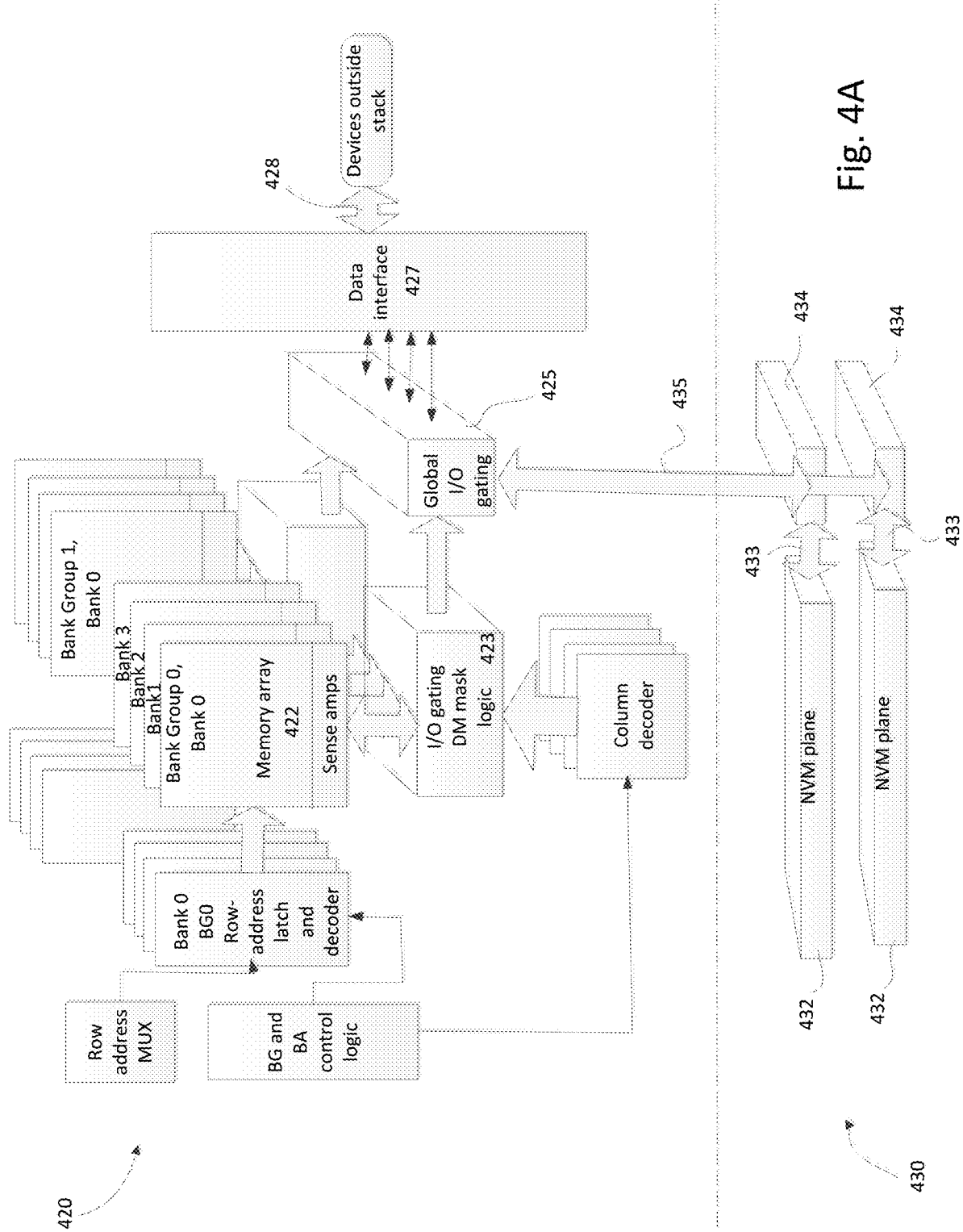
FIGS. 4A-B are example circuit diagrams of example stacks according to aspects of the disclosure.

FIG. 4A illustrates a first example circuit structure for the RAM-NVM stack. As shown, volatile memory (VM) portion 420 is coupled to an NVM portion 430 including stacked layers of NVM.

The VM portion 420 may be a layer of RAM, such as DRAM or other type of RAM. The VM portion 420 may include a memory array 422 including a plurality of memory banks. According to some examples, the memory array 422 may include multiple groups of memory, with each group having multiple memory banks. Each memory bank may include a plurality of sense amplifiers for use when reading data from the memory. The sense amplifiers may be coupled to a global I/O gate 425, such as through I/O gating mask logic 423. The global I/O gate may further be coupled to a data interface 427 for sending or receiving communications between the RAM portion 420 and other devices outside of the stack. For example, a bus 428 between the data interface 427 and off-chip devices can be any bus width, such as 4, 8, 16, 32, 64, 128 bits wide, etc. If an internal bus width is increased, the bus 428 width may also be increased.

The NVM portion 430 includes multiple NVM planes 432 or arrays, each NVM plane 432 being coupled to NVM sense amplifiers and drivers 434 through NVM array bus 433. The NVM array bus 433 may be, for example, 16,384 bits wide with optional error correction bits. The sense amplifiers and drivers 434 are further coupled to the global I/O gating 425 through bus 435. For example, the bus 435 may be any width, such as 128 bits or wider. In some examples, the bus 435 may be 1 k bit wide, 16 k bit wide, or greater.

Figure 4B:
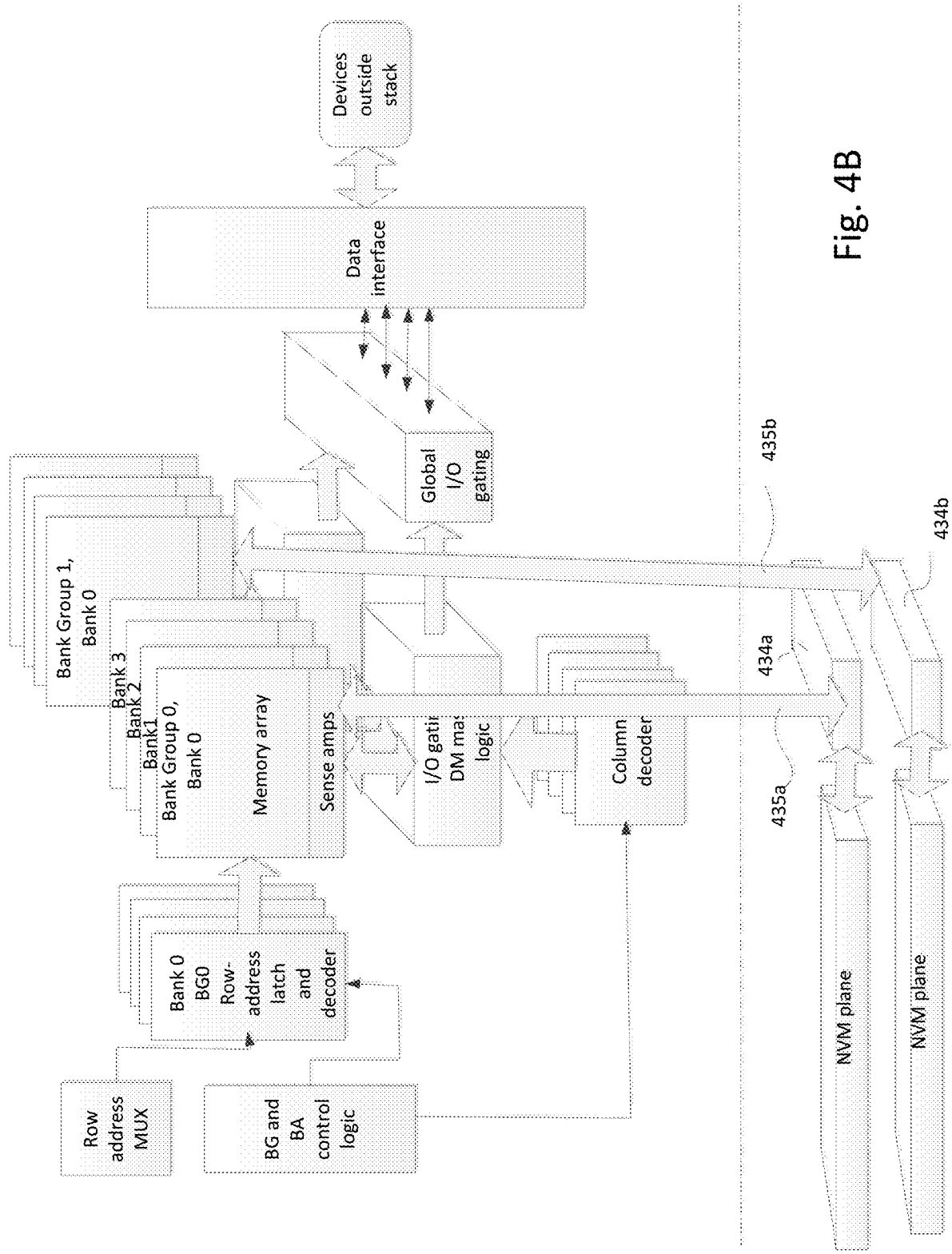

FIG. 4B illustrates another example including the VM portion 420 and the NVM portion 430. In this example, however, the sense amplifiers and drivers 434 of the NVM portion 430 are directly coupled to the sense amplifiers of the memory array 422 in the VM portion 420. For example, a first bus 435a may couple first sense amplifiers and drivers 434a to the sense amplifiers of the first group of the memory array 422. Similarly, a second bus 435b may couple second sense amplifiers and drivers 434b to the sense amplifiers of the second group of the memory array 422. While only two groups of memory arrays are shown, and two NVM planes, it should be understood that multiple additional memory array groups and NVM planes may be included.

According to some examples, rather than sending data in page sizes, the data may be sent in error correction code (ECC) chunks. For example, ECC information in a NAND page may be matched an ECC interval in a DRAM page.

Each layer of NAND in the NAND flash array plane may include extra bits. In this regard, the DRAM may overprovision data to be stored in the NAND, such that more bits are available than those advertised. In this regard, if a NAND location is starting to fail because it is being written to too often, the data can be redirected to a different set of cells in NAND.

Figure 5:
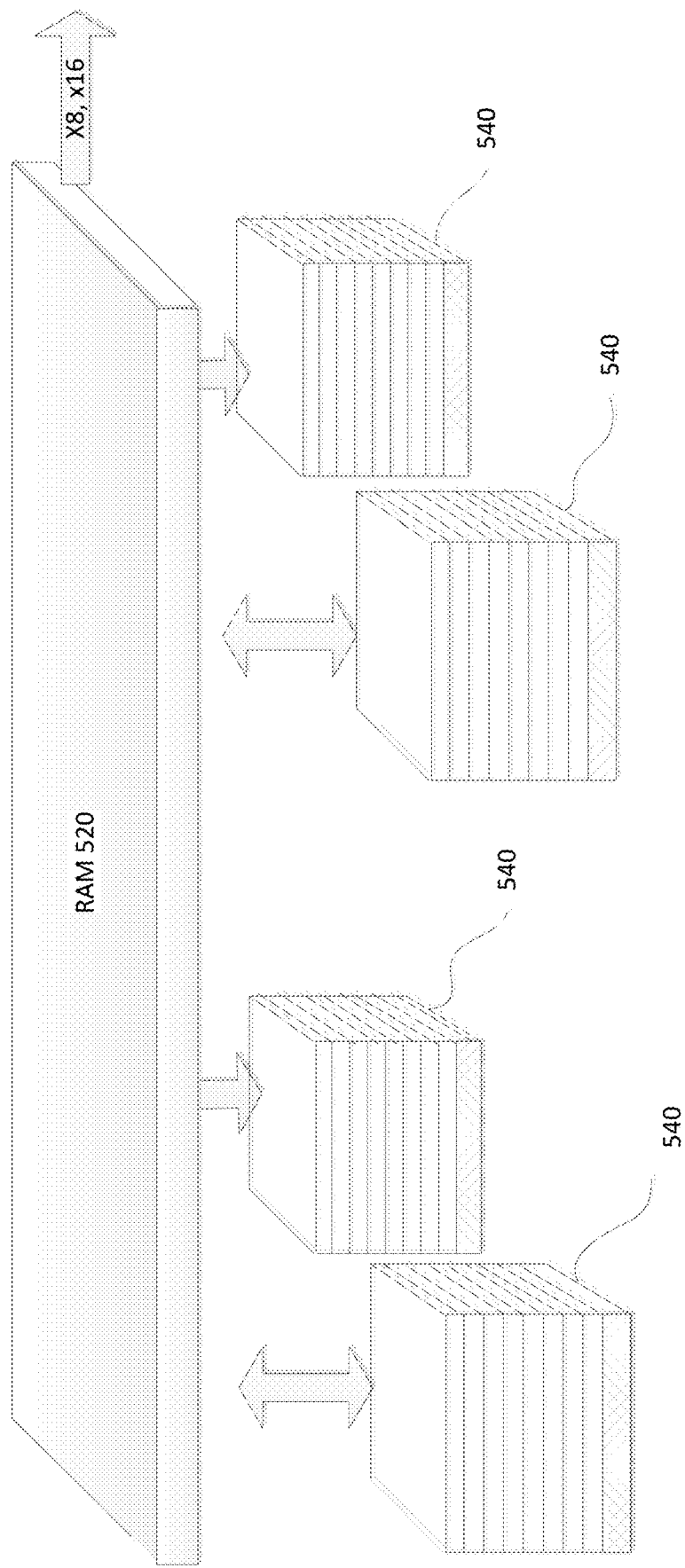
FIG. 5 is a perspective view of another example stacked memory combining RAM and multiple layers of NVM according to aspects of the disclosure.

FIG. 5 is a perspective view of another example stacked memory combining RAM and NVM. In this example, RAM 520 is a larger width than each of a plurality of NVM array planes 540 coupled thereto. Each array plane 540 has a register and multiple memory blocks of flash memory. The RAM 520 may be mounted over and connected to the plurality of flash array planes 540. For example, the RAM can be directly connected to a flash page (as shown), or it can be directly connected to a register. The RAM may be bonded to the flash page using low temperature bonding, hybrid bonding, or other types of bonding.

The RAM 520 is capable of outputting or inputting data fast enough to give a continuous pipeline of data. For example, data stored in the RAM may be retrieved in 25 μs or less. As another example, the NVM is capable of providing in parallel a page of M bits of data with a cycle time T1. The RAM memory locations can capture and store a page content within a time T2 that is less than or equal to the read cycle time T1 of the corresponding NVM flash page. According to some examples, the RAM 520 memory chip may be connected in total to N output nodes and each output node can provide a new bit of data in a time T3 that is equal to or less than $T1*N/(M*P)$, wherein P is a number of the NVM array planes 540. The stacked memory may be capable of providing a continuous stream of output data at a data rate=1/T3. In other examples, the data rate may be greater than 1/T3/1.25. By way of example only, if a page is 16,896 bits, and there are 2-8 NVM array planes 540, the total number of output nodes N to which the RAM chip may be connected=8-16.

Figure 6:
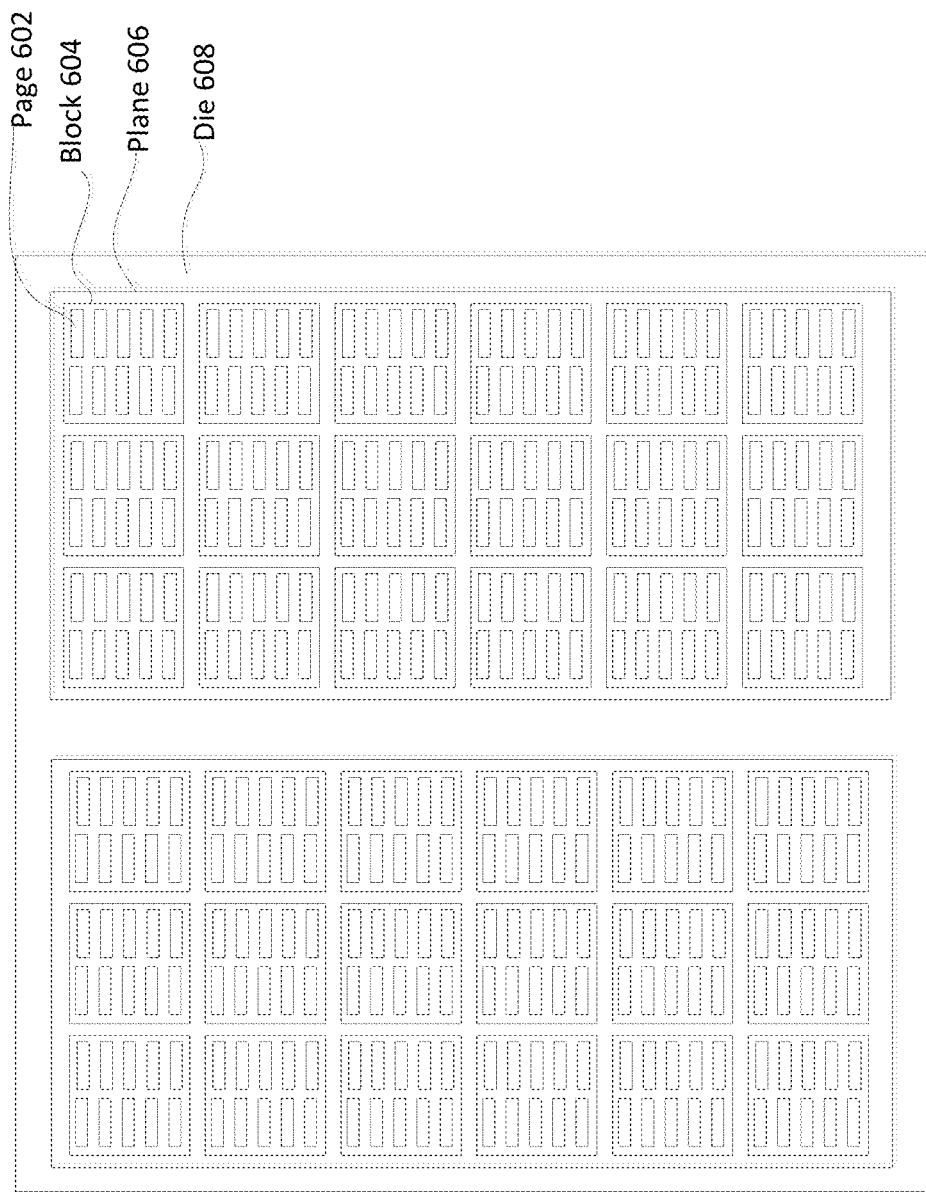
FIG. 6 is a top view of an example layer of NVM according to aspects of the disclosure.

FIG. 6 is a top view of an example layer of NVM. Each block 604 includes a plurality of pages 602. Each page 606 includes a plurality of blocks 604. Die 608 may include a plurality of pages 606. Above each plane 606 is a register (not shown) that can capture data in one of more of the pages 602. While here two pages 606 are shown, it should be understood that in other examples the die may include more pages. Similarly, while a number of block 604 and pages 602 are shown, it should be understood that the number may be varied.

Each plane 606 may operate independently. Accordingly, while a first plane of the die 608 is writing data, a second plane of the same die 608 may be reading a next operation from RAM.

According to some examples, in addition to being coupled to a first type of NVM, the RAM may also be coupled to other types of NVM, such as embedded NVM (ENVM). For example, the NVM and ENVM may share a same layer of the stack, such as if the NVM and ENVM are positioned alongside one another. As another example, the ENVM may be a separate layer of the stack from the NVM.

Figure 7:
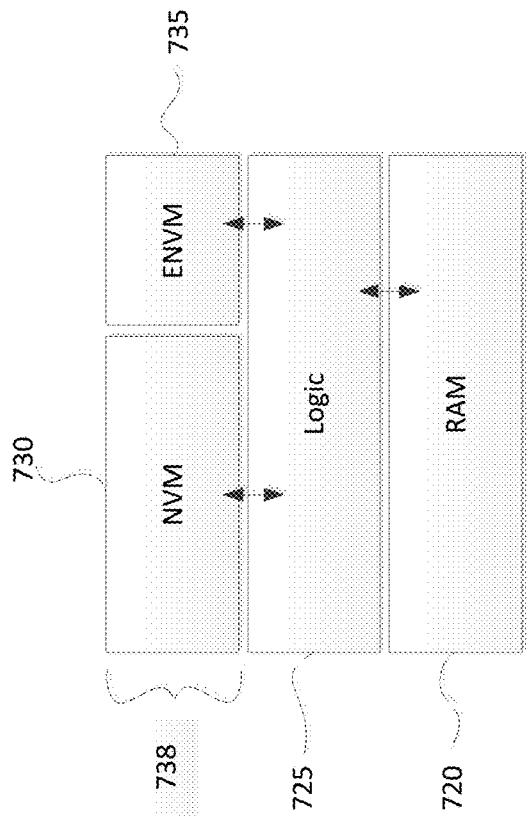
FIG. 7 is a side view of another example stacked memory combining RAM and one or more layers of NVM according to aspects of the disclosure.

FIG. 7 illustrates an example of the ENVM and the NVM sharing a layer of the stack. In this example, NVM 730 and ENVM 735 are positioned adjacent one another on a same layer 738 of the stack, above RAM 720. Though not shown, additional NVM layers may be stacked above the shared layer 738. Between the shared RAM 720 and the shared layer 738 is a logic layer 725. This logic layer 725 may be accessed by the RAM, for example, to determine whether to store data in short term or long term storage. Further, if the data is to be stored in long term storage, the logic may be accessed to determine whether to store the data using the NVM 730 or the ENVM 735. In this regard, the NVM 730 and the ENVM 735 may share the logic layer 725.

Figure 8:
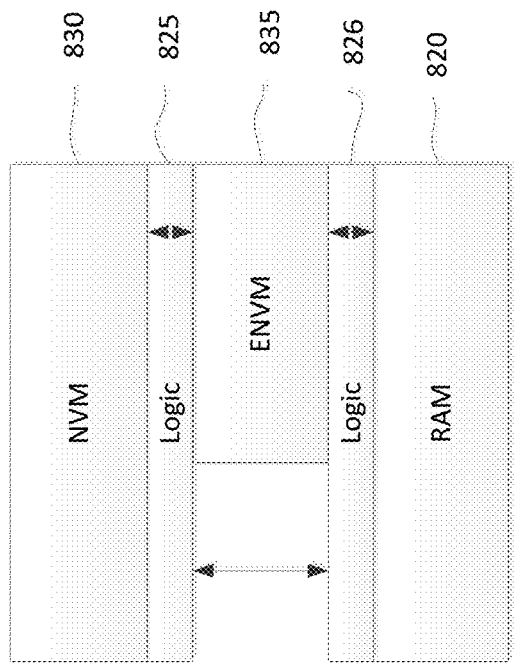
FIG. 8 is a side view of another example stacked memory combining RAM and one or more layers of NVM according to aspects of the disclosure.

FIG. 8 illustrates an example where the ENVM and NVM occupy different layers of the stack. In this example, ENVM 835 resides in its own dedicated layer in the stack between RAM 820 and NVM 830. Though not shown, additional NVM layers may be stacked above the NVM 830. The NVM 830 and the ENVM 835 may each have a logic layer 825, 826, respectively. The NVM 830 may communicate with the ENVM 835 through logic layer 825. The ENVM 835 may communicate with the RAM 820 through logic layer 826. While in some examples, the NVM 830 may communicate with the RAM 820 through the ENVM 835 and intervening logic layers 825, 826, in other examples the NVM 830 may communicate directly with the RAM 820 via a direct connection between the logic layers 825, 826. For example, any of a number of signal routing mechanisms may be used to form the connection, such as routing layers, hard-wired connection, pillars, etc. The ENVM 835 does not need to be a same physical size as each NVM die or wafer in the stack. For example, the ENVM 835 may occupy a space that is physically smaller than a space occupied by a layer of NVM 830, such as if a NVM wafer is bonded to an ENVM die.

While some examples of integrating ENVM have been described above, it should be understood that additional examples are possible. For example, ENVM may be stack between layers of NVM, logic for the ENVM may reside on the RAM, etc.

Example Applications

The combined RAM and NVM memory stack as described in the examples above may be used for storing data for any of a variety of applications. Just as one example, the stack may be used in machine learning applications, where weight memory is stored in the NVM layers and activations are stored in RAM. As weights and activations are input to and stored in the stack, multiply accumulate (MAC) operations may be output. The weight memory may be moved to RAM over the highly parallel path between the NVM in the stack and the RAM. Because this path is a short electrical distance, power consumption is relatively low. Moreover, such movement can be scheduled. For example, it may be determined that a first operation is always or often followed by a second operation that requires accessing the weight memory. In this regard, the weight memory may be queued into RAM each time the first operation is performed, without waiting for the second operation. Additionally, the NVM can concurrently write as the RAM is exchanging information with a controller, such as an application specific integrated circuit (ASIC) or system on chip (SoC). At the same time, the NVM can also start reading the next operation. Because different pins may be used for reading and writing at a given time, the RAM may continuously be supplied with data to store in NVM while also sending data off-chip. Each of the different pins may be bidirectional, and many different buses may be available. While the RAM is communicating with the controller, it is reading data or sending data. At the same time, internally, it could be moving data to the NVM.

Other example applications may include switching. For example, a layer of NVM may be reserved for a lookup table. Further example applications include high-performance compute applications, mobile devices, etc.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A stacked memory device, comprising:
a first layer comprising random access memory (RAM); and
a plurality of second layers vertically stacked above the first layer, each of the plurality of second layers comprising multiple blocks of nonvolatile memory (NVM),
wherein the first layer is directly bonded to an adjacent one of the second layers without an intervening material layer therebetween; and
wherein interconnects of the first layer are directly bonded to interconnects of the adjacent one of the second layers to form a plurality of parallel input/output (I/O) paths between the RAM and the NVM, wherein the parallel I/O paths are at least 1 k bits wide.

2. The stacked memory device of claim 1, wherein the first layer comprises a plurality of registers, and wherein the parallel I/O paths are configured to feed data into the plurality of second layers in less time than time duration for filling the plurality of registers with data input to the device from another device outside the stacked memory device.

3. The stacked memory device of claim 1, wherein the parallel I/O paths are configured to load in parallel data from an entire page of the NVM during a single clock cycle.

4. The stacked memory device of claim 1, wherein the parallel I/O paths are at least 16 k bits wide.

5. The stacked memory device of claim 1, wherein the parallel I/O paths comprise a plurality of bidirectional pins, wherein at least a first bidirectional pin is configured to read data while at least a second bidirectional pin writes data.

6. The stacked memory device of claim 1, wherein each of the plurality of second layers is directly bonded to another one of the plurality of second layers without an intervening material layer therebetween using low temperature direct bonding or hybrid bonding.

7. The stacked memory device of claim 1, wherein the first layer further comprises logic for the NVM.

8. The stacked memory device of claim 1, wherein the RAM is a dynamic random access memory.

9. The stacked memory device of claim 1, wherein the first layer comprises a plurality of separate volatile memory chips.

10. The stacked memory device of claim 1, wherein the nonvolatile memory is a NAND flash memory.

11. The stacked memory device of claim 1, wherein at least a first one of the second layers comprises one or more registers, and wherein I/O paths pipe data from the first layer into the one or more registers of the first of the second layers.

12. The stacked memory device of claim 1, wherein the first layer further comprises an external interface for coupling to devices outside of the stacked memory device, wherein the first layer is configured to:
identify a tag associated with data received by the first layer through the external interface;
determine, based on the tag, whether to store the data in the first layer or in one of the plurality of second layers.

13. The stacked memory device of claim 1, wherein at least one of the plurality of second layers comprises a first type of NVM, and at least a second one of the plurality of second layers comprises a second type of NVM different from the first type.

14. The stacked memory device of claim 1, wherein at least one of the plurality of second layers comprises both a first type of NVM and a second type of NVM different from the first type.

15. An assembly, comprising:
 a controller;
 a stacked memory device electronically coupled to the controller, the stacked memory device comprising:
  a first layer comprising random access memory (RAM); and
  a plurality of second layers vertically stacked above the first layer, each of the plurality of second layers comprising multiple blocks of nonvolatile memory (NVM),
  wherein the first layer is directly bonded to an adjacent one of the second layers without an intervening material layer therebetween; and
  wherein interconnects of the first layer are directly bonded to interconnects of the adjacent one of the second layers to form a plurality of parallel input/output (I/O) paths between the RAM and the NVM, wherein the parallel I/O paths are at least 1 k bits wide.

16. The assembly of claim 15, wherein at least one of the controller or the RAM is configured to:
 evaluate historic data usage;
 classify data received through the first layer based on the historic data usage; and
 determine whether to store the data in the first layer or in the plurality of second layers based on the classifying.

17. The assembly of claim 15, wherein at least one of the second layers comprises a NAND flash memory chip including one or more planes, each plane including multiple memory blocks of NAND flash memory, wherein a first of the one or more planes is configured for writing data while a second one of the one or more planes is configured for simultaneously reading data.

18. A circuit structure, comprising:
 a first layer comprising random access memory (RAM);
 a plurality of non-volatile memory (NVM) arrays bonded to the first layer, wherein each of the NVM arrays comprises a plurality of vertically stacked second layers, each of the second layers comprising multiple blocks of NVM,
 wherein the first layer is directly bonded to an adjacent one of the NVM arrays without an intervening material layer therebetween; and
 wherein interconnects of the first layer are directly bonded to interconnects of the adjacent one of the NVM arrays to form a plurality of parallel input/output (I/O) paths between the RAM and each of the plurality of NVM arrays, wherein the parallel I/O paths are at least 1 k bit wide.

19. The circuit structure of claim 18, wherein the first layer is bonded to the plurality of NVM memory arrays using low temperature direct bonding or hybrid bonding, and the vertically stacked second layers in each array are bonded to one another using low temperature direct bonding or hybrid bonding, wherein at least one of the second layers in each array comprises a NAND flash memory chip including one or more planes, each plane including multiple memory blocks of NAND flash memory, wherein a first of the one or more planes is configured for writing data while a second one of the one or more planes is configured for simultaneously reading data.

\* \* \* \* \*